United States Patent
Yoshida et al.

(10) Patent No.: US 8,080,935 B2
(45) Date of Patent: Dec. 20, 2011

(54) ORGANIC EL DISPLAY AND METHOD FOR MANUFACTURING SAME

(75) Inventors: Hidehiro Yoshida, Osaka (JP); Seiji Nakashima, Nara (JP); Toshiyuki Suemitsu, Osaka (JP)

(73) Assignee: Panasonic Corporation, Osaka (JP)

( * ) Notice: Subject to any disclaimer, the term of this patent is extended or adjusted under 35 U.S.C. 154(b) by 513 days.

(21) Appl. No.: 11/914,840

(22) PCT Filed: Sep. 29, 2006

(86) PCT No.: PCT/JP2006/319434
§ 371 (c)(1),
(2), (4) Date: Apr. 23, 2008

(87) PCT Pub. No.: WO2007/037358
PCT Pub. Date: Apr. 5, 2007

(65) Prior Publication Data
US 2009/0058268 A1 Mar. 5, 2009

(30) Foreign Application Priority Data

Sep. 29, 2005 (JP) ................... 2005-284326

(51) Int. Cl.
*H01J 1/62* (2006.01)
*H01J 63/04* (2006.01)
(52) U.S. Cl. ............. 313/504; 313/512; 445/25
(58) Field of Classification Search .......... 313/503, 313/504, 512
See application file for complete search history.

(56) References Cited

U.S. PATENT DOCUMENTS

| | | | |
|---|---|---|---|
| 5,920,080 A | 7/1999 | Jones | |
| 6,309,272 B1 * | 10/2001 | Nishimura ................ | 445/25 |
| 2003/0117071 A1 * | 6/2003 | Lee et al. ................. | 313/512 |
| 2004/0013899 A1 * | 1/2004 | Abe ........................ | 428/655 |
| 2004/0046497 A1 * | 3/2004 | Schaepkens et al. ....... | 313/506 |
| 2004/0080266 A1 * | 4/2004 | Park et al. ................ | 313/509 |
| 2004/0238815 A1 | 12/2004 | Park et al. | |
| 2005/0127829 A1 * | 6/2005 | Takahashi ................ | 313/504 |
| 2005/0200273 A1 * | 9/2005 | Nozawa ................... | 313/503 |
| 2007/0262705 A1 * | 11/2007 | Fukuda et al. ............ | 313/504 |
| 2008/0085418 A1 * | 4/2008 | Fukuda et al. ............ | 428/447 |

FOREIGN PATENT DOCUMENTS

| | | |
|---|---|---|
| JP | 2004-63304 A | 2/2004 |
| JP | 2004-127606 A | 4/2004 |
| JP | 2004-356095 A | 12/2004 |

(Continued)

OTHER PUBLICATIONS

English Language Abstract of JP 2004-127606 A.

(Continued)

*Primary Examiner* — Peter Macchiarolo
*Assistant Examiner* — Glenn Zimmerman
(74) *Attorney, Agent, or Firm* — Greenblum & Bernstein, P.L.C.

(57) ABSTRACT

Provided is a top emission type organic EL display, more specifically, an organic EL display having a specific sealing film and improved light extracting efficiency. The organic EL display provided with a top emission type organic EL element having the sealing film including a transparent inorganic material is characterized in that the density of a transparent inorganic material for an inner layer of the sealing film is lower than the density of a transparent inorganic material for an outer layer of the sealing film. The transparent inorganic material is silicon oxide, silicon nitride, silicon oxynitride, aluminum nitride or the like. Thus, the low power consumption organic EL display is provided.

11 Claims, 4 Drawing Sheets

FOREIGN PATENT DOCUMENTS

| | | |
|---|---|---|
| JP | 2006-338947 A | 12/2006 |
| WO | WO 2005099311 A1 * | 10/2005 |
| WO | WO 2006033233 A1 * | 3/2006 |

OTHER PUBLICATIONS

English Language Abstract of JP 2004-63304 A.
English Language Abstract of JP 2006-338947 A.
English Language Abstract of JP 2002-508108 T, Mar. 12, 2002.
Yamasaki et al., Organic Light-Emitting Device with an Ordered Monolayer of Silica Microspheres as a Scattering Medium:, Applied Physics Letters, vol. 76, No. 10, pp. 1243-1245 (2000).
Möller et al., "Improved Light Out-Coupling in Organic Light Emitting Diodes Employing Ordered Microlens Arrays", Journal of Applied Physics, vol. 91, No. 5, pp. 3324-3327 (2002).
Tsutsui et al., "Doubling Coupling-Out Efficiency in Organic Light-Emitting Devices Using a Thin Silica Aerogel Layer", Advanced Materials, vol. 13, No. 15, pp. 1149-1152 (2001).

* cited by examiner

ORGANIC EL DISPLAY AND METHOD FOR MANUFACTURING SAME

TECHNICAL FIELD

The present invention relates to an organic EL display. More particularly, the present invention relates to a top-emission organic EL display and the manufacturing method thereof.

BACKGROUND ART

An organic EL display includes organic EL elements arranged in a matrix form on the substrate. Organic EL elements can be roughly classified into the passive type and the active type, and it is preferable that both types have a sealing film that covers the organic EL laminated body (including the organic light emitting layer). The sealing film can keep the organic EL laminated body from moisture or oxygen present external to the elements.

In addition, organic EL elements can be roughly classified into the bottom-emission type and the top-emission type. With organic EL elements of the bottom-emission type, light from the light emitting layer is extracted through the substrate. On the other hand, with organic EL elements of the top-emission type, light from the light emitting layer is extracted through the sealing film. Therefore, the substrate for organic EL elements of the bottom-emission type needs to be transparent and the sealing film for organic EL elements of the top-emission type needs to be transparent.

The efficiency with organic EL elements for extracting light from the light emitting layer to the outside depends largely on the substrate for the bottom-emission type and depends largely on the sealing film for the top-emission type. For example, by suppressing total reflections in the interface between the substrate or sealing film and the outside (atmosphere), the extraction efficiency can increase. To suppress the reflections, methods of scattering light such as by arranging silica spheres on the outer surface of the substrate (see Non-Patent Document 1) and by forming micro-projections and depressions (e.g., forming a microlens array) in the outer surface (see Non-Patent Document 2) have been proposed.

Methods of increasing light extraction efficiency by arranging silica spheres (Non-Patent Document 1) or arranging silica aerogel (Non-Patent Document 3) on the inner surface of the substrate (the surface where the organic light emitting layer is provided) are also proposed.

Non-Patent Document 1: Applied Physics Letters, Volume 76, Number 10, p 1243 (2000). Takashi Yamasaki et al.
Non-Patent Document 2: Journal of Applied Physics, Volume 91, Number 5, p 3324 (2002). S Moller et al.
Non-Patent Document 3: Advanced Material, Volume 13, p 1149 (2001). T. Tsutsui et al.

DISCLOSURE OF INVENTION

Problems to be Solved by the Invention

As described above, the efficiency of extracting light from the light emitting layer of organic EL light-emitting elements depends on material and structure of the substrate (for the bottom-emission type) or the sealing film (for the top-emission type). In the case that light is scattered on the outer surface of the substrate or sealing film, although the light extraction efficiency increases, the light-emitting point may blur, which then causes image blur. There are also other cases with other techniques where the extraction efficiency does not improve much and the structure becomes impractically complicated.

Means for Solving the Problem

The present inventors have found that, by forming the sealing film for the top-emission organic EL light emitting elements with a transparent inorganic material such as glass and controlling the density of the transparent inorganic material of the sealing film, the light extraction efficiency can be increased. That is to say, the present inventors have found that, by making the density of the transparent inorganic material in the inner layer of the sealing film lower than the density in the outer layer, light from the light emitting layer is scattered and the light extraction efficiency increases, and more the light emitting point is prevented from blurring. And then the present invention has been achieved.

Specifically, the first aspect of the present invention covers the following displays:

[1] A display comprising a top-emission organic electroluminescence element having a sealing film containing a transparent inorganic material, and, in this display, the density of the transparent inorganic material in an inner layer of the sealing film is lower than the density of the transparent inorganic material in an outer layer of the sealing film.

[2] The display of [1], in which the transparent inorganic material is material selected from the group consisting of silicon oxide, silicon nitride, silicon nitride-oxide, and aluminum oxide.

[3] The display of [1] or [2], in which the density of the transparent inorganic material in the inner layer of the sealing film is determined by binarizing a scanning electron microscopy image of a cross section of the sealing film and is 74% or less.

[4] The display of any one of [1] to [3], in which the density of the transparent inorganic material in the inner layer of the sealing film is determined by binarizing a scanning electron microscopy image of a cross section of the sealing film and is 50% or less.

[5] The display of any one of [1] to [4], in which the density of the transparent inorganic material in the outer layer of the sealing film is determined by binarizing a scanning electron microscopy image of a cross section of the sealing film and is 90% or more.

[6] The display of any one of [1] to [5], in which a thickness of the sealing film is in a range of 0.1 μm to 10 μm.

[7] The display of any one of [1] to [6], in which a thickness of the sealing film is in a range of 1 μm to 10 μm.

In addition, the present inventors have found out that by forming a sealing film through adequately adjusting conditions of film formation according to the sputtering method, the ion plating method, or the plasma CVD method, or through radiating light onto a layer which is obtained by applying a paste including particles of a transparent inorganic material, the density of the transparent inorganic material of the sealing film can be appropriately controlled. And then, the present invention have been achieved.

Specifically, a second aspect of the present invention covers the following display manufacturing methods:

[8] A manufacturing method of the display of [1], comprising the steps of: providing a component where the sealing film is to be formed, and a target; and an ion striking the target to generate a sputtered atom or molecule, and making the sputtered atom or molecule adhere to the component to form the sealing film, and, in this method, the forming of the sealing film is performed while increasing an ambient temperature of the component, reducing a distance between the component and the target, increasing a voltage applied to between the component and the target, increasing a frequency of a power supply for applying the voltage, increasing an amount of ions to strike the target, or increasing an amount of gas for a source of the ion.

[9] A manufacturing method of the display of [1], comprising the steps of: supplying a source gas to a component where the sealing film is to be formed; and generating plasma with a high frequency discharge electrodes under presence of the source gas to form the sealing film, and, in this method, the forming of the sealing film is performed while increasing an ambient temperature of the component, reducing a distance between the component and the high frequency discharge electrodes, increasing a voltage between the high frequency discharge electrodes, increasing a frequency of a power supply for applying the voltage, or increasing a density of the source gas.

[10] A manufacturing method of the display of [1], comprising the steps of: proving a component where the sealing film is to be formed, and a target provided facing the component; generating plasma around the target to generate ion from the target; and the ion striking the component to form the sealing film, and in this method, the forming of the sealing film is performed while increasing a velocity of the striking ion, increasing an ambient temperature of the component, reducing a distance between the component and the target, or increasing a frequency of a power supply for generating the plasma.

[11] A manufacturing method of the display of [1], comprising the steps of: applying a paste containing particles of a transparent inorganic material to a component where the sealing film is to be formed; and radiating a laser to the applied membrane of the paste.

Advantageous Effect of the Invention

The display of the present invention provides a low-energy display in which the light extraction efficiency of organic EL elements in the display is high. In addition, the density of the inorganic material in the sealing film varies between the inner layer and the outer layer, so that the membrane stress is reduced and the sealing film can be made relatively thick. If the sealing film is made thicker, the strength increases and thus the film is less likely to be destroyed.

BEST MODE FOR CARRYING OUT THE INVENTION

1. Display of the Present Invention

A display according to the present invention includes a plurality of organic EL elements and these organic EL elements are preferably arranged in a matrix form on a substrate. Although the organic EL elements may be either the passive type or the active type, but one feature of these organic elements is being the top-emission type. A top-emission organic EL element refers to an element in which light from the light emitting layer is extracted through the sealing film.

The organic EL elements included in the display of the present invention each have a sealing film and the sealing film is made of materials including transparent inorganic materials. Generally, the sealing film covers the whole of an entire organic EL element to keep the organic EL laminated body (described later) from external oxygen and moisture, and consequently, the sealing film is preferably made of inorganic materials. Furthermore, the sealing film for top-emission organic EL element also serves as a path for light from the light emitting layer, and thus, it is preferable that the sealing film be composed of a material with high transparency.

Examples of transparent inorganic material included in the sealing film include silicon oxide, silicon nitride, silicon nitride-oxide, and aluminum oxide, but are not particularly limited to these. The sealing film may include materials besides the transparent inorganic material, such as transparent organic material (e.g., transparent resin) and solvent, as long as these materials do not damage the advantages of the present invention. Particularly, other materials remaining in the process of forming the sealing film may be included in the sealing film.

One feature of the sealing film for organic EL element of the present invention is that the density of the transparent inorganic material in the inner layer is lower than the density of the transparent inorganic material in the outer layer. The "inner layer" of the sealing film refers to the layer of the sealing film on the side where the light emitting layer is provided. On the other hand, the "outer layer" of the sealing film refers to the layer of the sealing film on the side where the light emitting layer is not provided, and is generally the side of the sealing film exposed to atmosphere.

Figure 1:
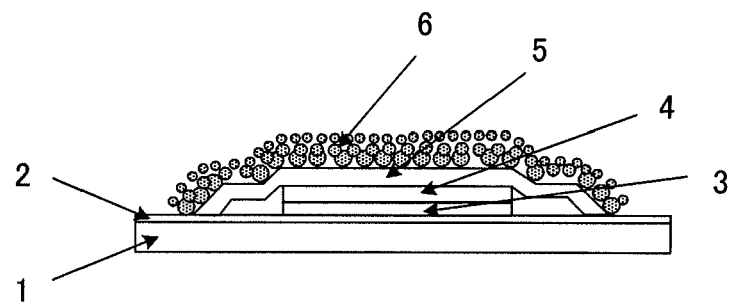
FIG. 1 is a diagram showing an overview of an organic EL element included in the display of the present invention, where the inner layer of sealing film 6 includes large size particles of transparent inorganic material and has low density, and where the outer layer of sealing film 6 includes small size particles of transparent inorganic material and has high density.
Figure 2:
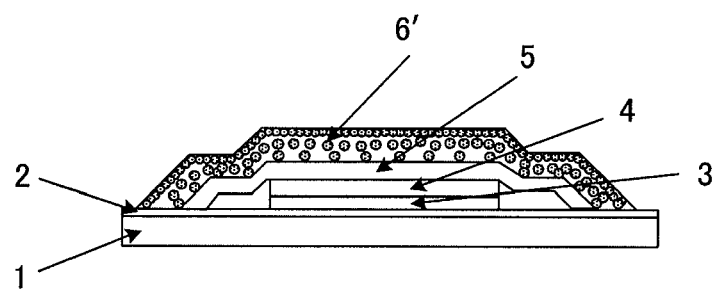
FIG. 2 is a diagram showing an overview of an organic EL element included in the display of the present invention, where the inner layer of sealing film 6' has a smaller number of particles of transparent inorganic material and has low density, and where the outer layer of sealing film 6' has a larger number of the particles and has high density.

FIGS. 1 and 2 schematically show examples of a sealing film included in an organic EL display of the present invention. The organic EL display shown in FIG. 1 includes substrate 1, moisture-proof film 2, cathode electrode 3, organic light emitting layer 4, anode electrode 5, and sealing film 6. Sealing film 6 contains a transparent inorganic material. To be more specific, the inner layer of sealing film 6, that is, the side of sealing film 6 where organic light emitting layer 4 is provided, includes large size particles of transparent inorganic material, while the outer layer of sealing film 6, that is, the side of sealing film 6 where organic light emitting layer 4 is not provided, includes small size particles of transparent inorganic material. The larger size of the particles is, the lower the density and the finesses of the film are. And the smaller size of the particles is, the higher the density and the finesses of the film are. The organic EL display shown in FIG. 2 includes substrate 1, moisture-proof film 2, cathode electrode 3, organic light emitting layer 4, anode electrode 5, and sealing film 6'. Sealing film 6' includes transparent inorganic material. To be more specific, the inner layer includes a smaller number of particles of transparent inorganic material and consequently provides a coarse texture, and, on the other hand, the outer layer includes a larger number of particles of transparent inorganic material and consequently provides a finer texture.

The adjustment of the density (texture) of transparent inorganic material in the sealing film is not limited to the examples shown in FIG. 1 or 2.

The density of the transparent inorganic material in the sealing film can be determined by the binarizing processing of an SEM image of a cross section of the sealing film. Examples of binarizing processing include fixed threshold value processing, variable threshold value processing, adaptive binarizing processing, and constant variance enhancement processing, but usually, variable threshold value processing is preferable for use. These methods are described in, for example, *Introduction to Digital Image Processing*, pp. 63 to 67 (CQ Publishing, Co., Ltd.) and *Image Data Processing for Scientific Measurement*, pp. 111 to 117 (CQ Publishing, Co., Ltd.).

The "inner layer" upon calculation of density by binzarizing processing refers to, for example, "30% of the thickness of the film from the inner surface of the film." Similarly, the "outer layer" upon calculation of density by binarizing processing refers to, for example, "30% of the thickness of the film from the outer surface of the film."

The density of the transparent inorganic material in the inner layer of the sealing film should be lower than that of the outer layer. To be more specific, the density of the transparent inorganic material in the inner layer of the sealing film is preferably 74% or less, more preferably 50% or less, and even more preferably 30% or less. The lower limit of the density is not particularly limited but should be 20% or more. By reducing the density of the transparent inorganic material in the inner layer, light from the light emitting layer is scattered inside the sealing film and reflection is reduced, so that the light extraction efficiency increases.

The density of the transparent inorganic material in the outer layer of the sealing film should be higher than that of the inner layer. To be more specific, the density of the transparent inorganic material in the outer layer of the sealing film is preferably 90% or more. By increasing the density of the outer layer of the sealing film, image blur is prevented, making it possible to obtain clear images.

The density of the transparent inorganic material in the sealing film should be low in the inner layer and high in the outer layer, and the density in the intermediate layer is not particularly specified. For example, the density may be increased gradually from the inner layer towards the outer layer.

The thickness of the sealing film is not particularly limited and may be defined, for example, in the range of 0.1 μm to 10 μm. As described above, with the sealing film of the present invention, the density of the transparent inorganic material varies between the inner layer and the outer layer, and consequently, the film stress may be low compared to a stress of a film with uniform density. For example, a silicon oxide film being thicker than approximately 0.1 μm formed by sputtering is usually likely to be destroyed by the film stress. On the other hand, the thickness of the sealing film of the present invention can be made 1 μm or more and preferably 2 μm or more. Since the sealing film can be made thick, the strength of the sealing film can be increased, making it possible to enhance the practicality of the organic EL display.

The outer layer surface configuration of the sealing film may be uniform. Providing projections and depressions on the outer layer surface configuration of the sealing film might cause light scattering and increase light extraction efficiency. However, with the sealing film of the present invention, the density of the inorganic material in the inner layer is reduced, so that the projections and depressions need not be provided on the outer layer surface of the sealing film. Although a sealing film of which projections and depressions are provided on the outer layer surface configuration may cause the light-emitting point to blur and images on the display to blur, these problems are not applicable to the sealing film of the present invention.

The organic EL element of the present invention employs the same structure as the normal top-emission organic EL element except in having the above-described sealing film. Namely, the organic EL element of the present invention increase light extraction efficiency by bringing the sealing film onto direct contact with the transparent electrode or by providing the sealing film on a transparent electrode via an arbitrary layer (a resin layer, for example) provided therebetween.

An example of a top-emission organic EL element will be described below with reference to drawings.

Figure 3:
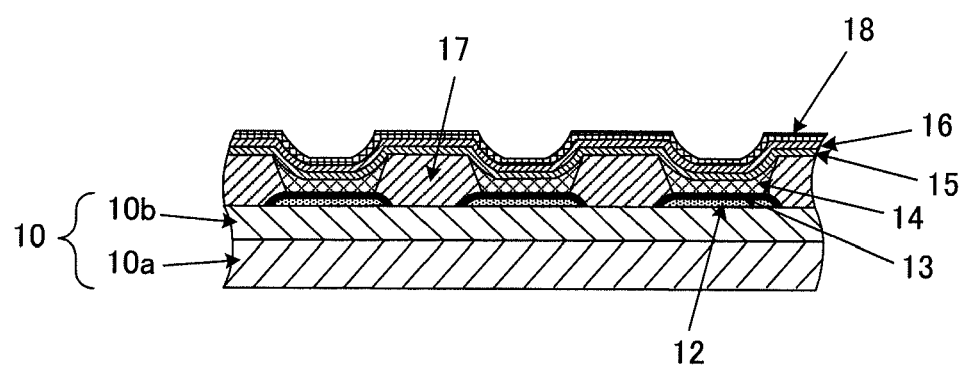
FIG. 3 is a diagram showing an example of an active organic EL element included in the display of the present invention.

FIG. 3 shows an example of an active organic EL element. The organic EL element shown in FIG. 3 includes element substrate 10 including substrate 10a and circuit element section 10b; an organic EL laminated body including electrode 12, positive hole injection/transport layer 13, organic EL layer 14, electron injection layer 15, transparent electrode layer 16, and bank layer 17; and sealing film 18.

Provided that light emitted from organic EL layer 14 is extracted through electron injection layer 15, transparent electrode layer 16 and sealing film 18, these layers and film are preferably made of transparent materials. As described above, sealing film 18 contains transparent inorganic material and the density in the inner layer is made lower than the density in the outer layer, so as to scatter light emitted from organic EL layer 14 and to increase the light extraction efficiency. An example of transparent electrode 16 includes an ITO electrode. The light extraction efficiency may be increased by scattering light from organic EL layer 14 through reducing the density of ITO in the ITO electrode.

The organic EL elements included in the organic EL display of the present invention may be the passive type.

2. Manufacturing Method of the Organic EL Display of the Present Invention

The organic EL display of the present invention can be made by adequately employing conventional manufacturing methods, except for controlling the density of the transparent inorganic material in the inner layer and the outer layer of the sealing film.

Examples of the method of forming the above-described sealing film include, and are by no means limited to, (1) the sputtering method, (2) the plasma CVD method, (3) the ion plating method and (4) the printing method.

(1) Sputtering Method

The formation of a sealing film by the sputtering method may be performed by providing a component where a sealing film is to be formed and a target, an ion striking the target to generate a sputtered atom or molecule, and making the sputtered atom or molecule adhere to the component to form the film, and in this method, while the sealing film is formed, one selected from the following is carried out: (A) increasing the ambient temperature of the component; (B) reducing the distance between the component and the target; (C) increasing the amount of ions to strike the target; (D) increasing the amount of the gas which serves as source of the ions; and (E) adjusting other parameters. In the case of applying voltage between the component and the target, (F) increasing the voltage applied to between the component and the target or (G) increasing the frequency of the power supply, may be possible as well.

A component where a sealing film is to be formed may be a transparent electrode of an organic EL element, or may be a planarizing layer or the like provided on a transparent electrode, or may be others (including a color filter layer for providing colors, and the like), but is preferably the transparent electrode. It is preferable that the sealing film to be formed covers the entire organic EL element.

The above-described target is adequately selected according to the material (transparent inorganic material) of the sealing film to be formed. For example, to form a silicon oxide film, silicon oxide should be used as a target, and, to form a silicon nitride film, silicon nitride should be used as a target. An ion to strike the target is not particularly limited, and, for example, an ion of an inert gas (for example, argon) may be used.

While forming a sputtering film, by adjusting parameters, as described in (A) to (G) above, the density of the transparent inorganic material in the outer layer of the sealing film to be formed can be made higher than the density in the inner layer. That is, in earlier stages of film formation, layer with low density (that is, buffer layer) is formed under relatively mild conditions (e.g., a low temperature condition), and, in a final stage of film formation, a layer with high density is formed under relatively severe conditions (e.g., a high temperature condition).

The ambient temperature of the above-described component is preferably increased by radiating light from a heating lamp onto the component or by heating from a heater incorporated in the stage where the component is placed. The "ambient temperature of the component" refers to either the temperature of the component itself on which a film is formed or the temperature of the surroundings of the component.

Figure 4:
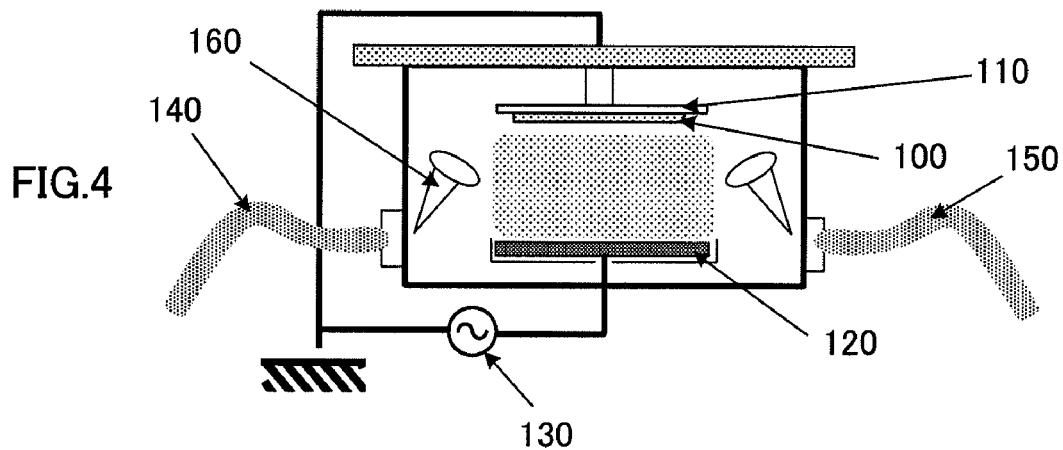
FIG. 4 is a diagram showing an example of a high frequency sputtering apparatus for forming the sealing film for organic EL element.

FIG. 4 shows an example of a state in which a sealing film is formed using a high frequency sputtering apparatus. Component 100 where a sealing film is to be formed is placed on stage 110 having a heating mechanism. Target 120 is placed facing component 100. A high frequency voltage is applied between component 100 and target 120 with high frequency power supply 130. An inert gas such as an argon gas is introduced from gas introduction line 140 and released through gas release line 150. A high frequency voltage is applied under an inert gas atmosphere to generate plasma, thereby ionizing the inert gas. The ionized inert gas strikes target 120 to generate a sputtered atom or molecule, and the sputtered atom or molecule adhere to component 100, thereby a sealing film composed of an inorganic material is formed.

Figure 5:
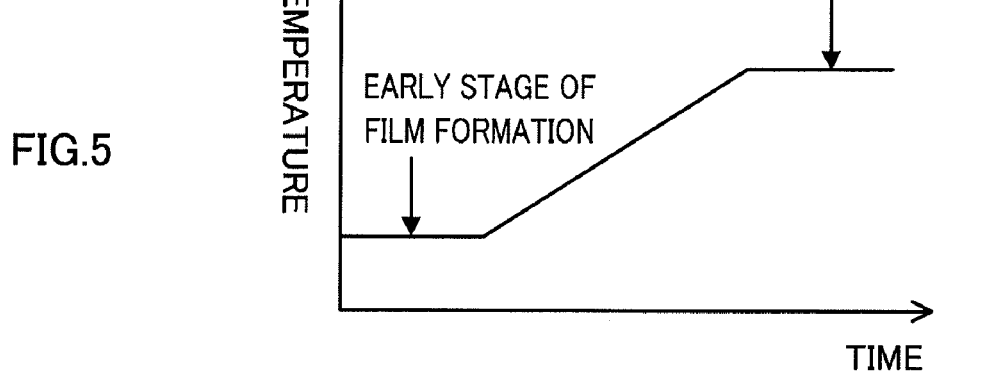
FIG. 5 is a diagram showing an example of a temperature profile for use in forming a sealing film.

At this time, the ambient temperature of component 100 is increased using heating lamps 160 or the heating mechanism of stage 110 or a combination thereof. By doing so, the density of an inorganic material of the sealing film to be formed can be increased gradually. FIG. 5 shows an example of an ambient temperature profile. In earlier stages of film formation, plasma is generated at relatively low temperature to form a sealing layer. The layer formed in earlier stages can be buffer layer with low density, so that component 100 is less susceptible to damage. Subsequently, the temperature is increased gradually and a layer with high density is overlaid, thereby forming a sealing film. The temperature in earlier stages of film formation is approximately 10 to 30° C., and the temperature in the final stage of film formation is preferably approximately 200° C.

Stage 110 shown in FIG. 4 may be brought closer to target 120 gradually; the amount of inert gas to be introduced from gas introduction line 140 may be increased; the frequency of high frequency power supply 130 may be increased; or the voltage of power supply 130 may be increased, thereby the texture (the density of the inorganic material) of the sealing film is controlled.

Figure 6:
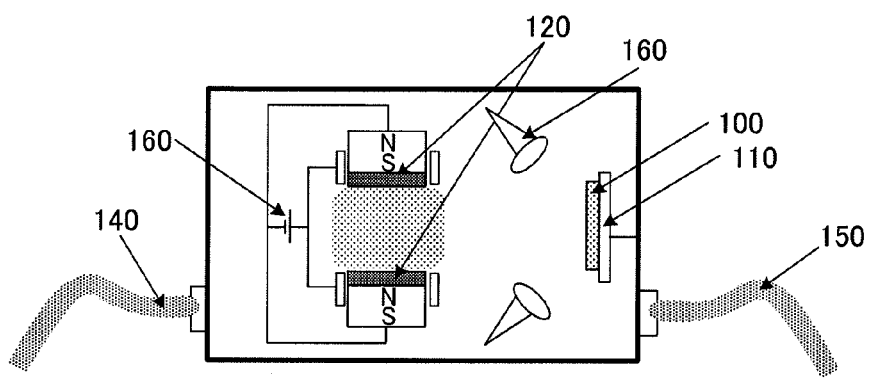
FIG. 6 is a diagram showing an example of facing target sputtering apparatus for forming a sealing film for organic EL element.

FIG. 6 shows an example of a state in which a sealing film is formed with a facing target sputtering apparatus. Component 100 where a sealing film is to be formed is placed on stage 110 having a heating mechanism. Targets 120 facing each other are provided. While voltage is applied to between the both targets with an RF power supply, a magnetic field is generated between the targets, thereby high energy electrons are confined. An inert gas such as an argon gas is introduced from gas introduction line 140 and released through gas release line 150. The introduced inert gas is ionized by the electrons and strikes target 120 to generate a sputtered atom or molecule, and the sputtered atom or molecule adhere to component 100, thereby a sealing film composed of an inorganic material is formed. At this time, for example, by increasing the ambient temperature of component 100 with heating lamps or the heating mechanism of stage 110, by increasing the amount of inert gas to be introduced, or by increasing the voltage, the texture (the density of the inorganic material) of the sealing film to be formed is changed.

By using a sputtering apparatus where targets are provided facing each other, damaging component 100 by plasma can be prevented.

(2) Plasma CVD Method

The formation of a sealing film by the plasma CVD method may be performed by supplying a source gas to a component where a sealing film is to be formed, and, in the presence of the source gas, generating plasma with a high frequency discharge electrode to form a sealing film on the component, and, in this method, while the sealing film is formed, one selected from the following is carried out: (A) increasing the ambient temperature of the component; (B) reducing the distance between the component and the high frequency electrode; (C) increasing the frequency of the high frequency discharge electrode; (D) increasing the frequency of the power supply for supplying the voltage; (E) increasing the concentration of the source gas; and (F) adjusting other parameters.

The component where the sealing film is to be formed can be the same as the component used in the above sputtering method. The source gas is selected adequately according to the material (transparent inorganic material) of the sealing film to be formed. For example, to form a silicon nitride film, a mixed gas containing a silane gas (e.g., $SiCl_2H_2$ or $SiH_4$) and ammonia should be used as a source gas, and, to form a silicon oxide film, a mixed gas containing a silane gas and oxygen should be used as a source gas.

Figure 7:
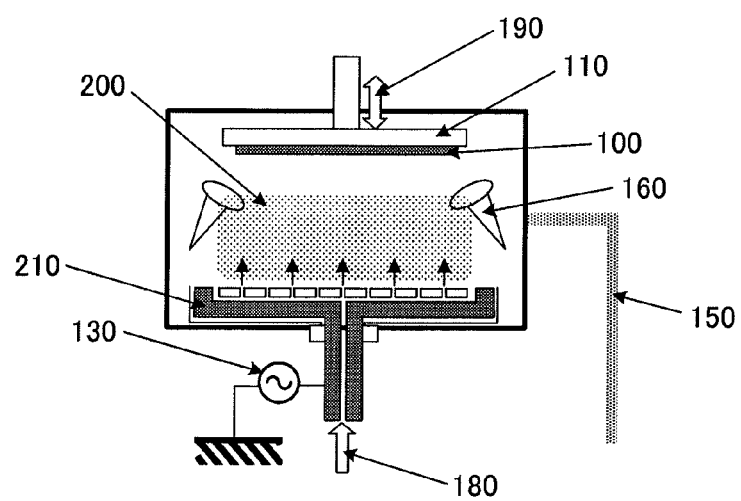
FIG. 7 is a diagram showing an example of a plasma CVD apparatus for forming a sealing film for organic EL element.

FIG. 7 shows an example of a state in which a sealing film is formed with a plasma CVD apparatus. Component 100 where a sealing film is to be formed is placed on stage 110 having a heating mechanism and stage 110 can be moved up and down by up-down mechanism 190. And more, high frequency discharge electrode 210 is provided so as to face component 100 and voltage is applied to between high frequency discharge electrode 210 with high frequency power supply 130 to generate plasma 200. Source gas 180 to be introduced is activated by plasma 200, thereby forming a sealing film on component 100. A part of the source gas 180 that does not react is released through gas release line 150.

In earlier stages of formation of the sealing film, component 100 is preferably cooled. Cooling may be performed by water cooling or air cooling with the heating mechanism of stage 110 or by cooling with a Peltier element and so on. When the ambient temperature of component 100 is low, the layer with coarse texture (the density of the inorganic material) may be formed, and consequently component 100 becomes less susceptible to damage.

Next, the ambient temperature of component 100 is increased gradually (the temperature profile can be the same as in FIG. 5). The ambient temperature may be increased by increasing the temperature in a chamber by the heating mechanism of stage 110, light radiation with heating lamps 160, or Nichrome heating wire (not shown) covering the inner wall of the chamber. By this means, a sealing film in which the density of the inorganic material is controlled is formed.

Instead of the changing the ambient temperature, by reducing the distance between component 100 and high frequency electrode 210 (keeping the distance long in earlier stages and reducing the distance gradually), by increasing the frequency of high frequency power supply 130, by increasing the voltage, or by increasing the source concentration of source gas 180a, the sealing film where the density of the inorganic material is controlled may be formed.

(3) Ion Plating Method

The formation of a sealing film by the plasma CVD method may be performed through providing a component where a sealing film is to be formed, and a target provided facing the component, generating plasma around the target to generate ion from the target, and the ion striking the component to form a film, and, in this method, while the sealing film is formed, one selected from the following is carried out: (A) increasing the ion striking speed, (B) increasing the ambient temperature of the component, (C) reducing the distance between the component and the target, (D) increasing the frequency of a power supply for generating plasma, or (E) adjusting other condition.

The component where the sealing film is to be formed can be the same as the component used in the above sputtering method. Similar to the sputtering method, to form a silicon oxide film, silicon oxide may be used for the target, and, to form a silicon nitride film, silicon nitride may be used for the target.

The means of controlling the ion striking speed is not particularly limited, and, for example, one method is to adjust the voltage between the electrode (also referred to as the "extracting electrode") for accelerating generated ion.

Figure 8:
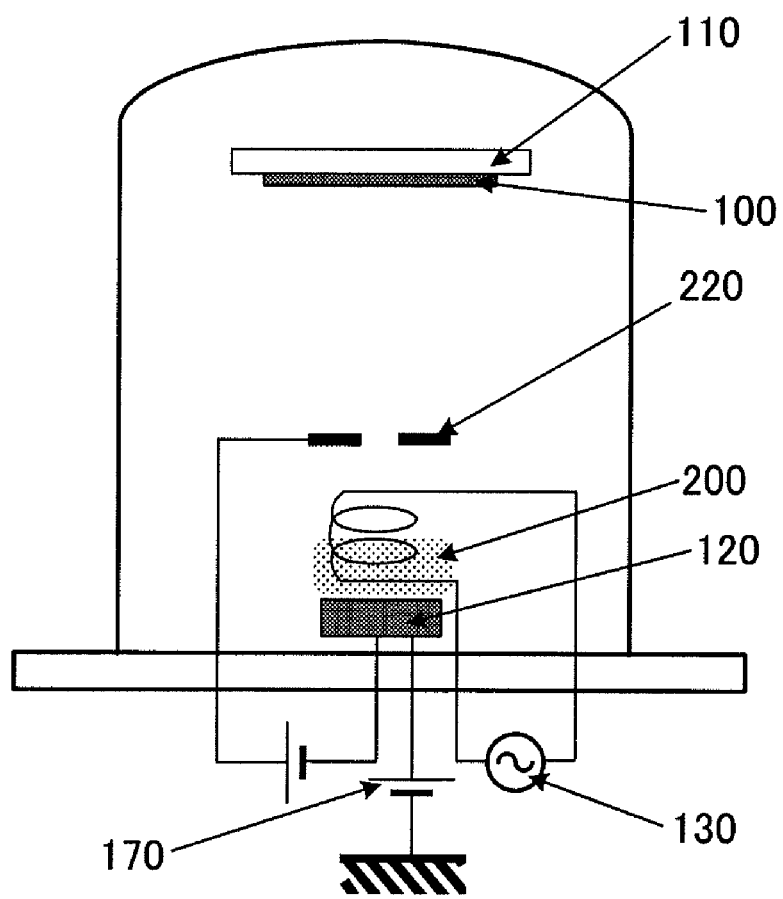
FIG. 8 is a diagram showing an example of an ion plating apparatus for forming a sealing film for organic EL element.

FIG. 8 shows an example of a state in which a sealing film is formed with an ion plating apparatus. Component 100 where a sealing film is to be formed is placed on stage 110 having a heating mechanism. Target 120 is provided, and a coil connected to high frequency power supply 130 for generating plasma is provided around target 120. A voltage is applied between target 120 and extraction electrode 220. Ion generated from target 120 by plasma strikes component 100 at speed according to the voltage applied between extraction electrode 220 and target 120 to form a sealing film.

In earlier stages of the formation of the sealing film, the voltage between target 120 and extraction electrode 220 is set low and the speed at which the ion move towards component 100 (the speed of ion beam) is set low. By this means, the fineness of the membrane formed on component 100 is reduced (that is, layers with low density are formed) and damage to component 100 is reduced. Next, with increasing the above-described voltage, the speed of ion beam is increased, and the density of the film formed on component 100 is increased.

Instead of the increasing the voltage, by increasing the ambient temperature of component 100 with the heating mechanism of stage 110, by reducing the distance between component 100 and target 120, or by increasing the frequency of high frequency power supply 130, the sealing film where density is controlled may be formed (4) Application Method The formation of a sealing film by the application method may be performed through applying a paste containing particles of a transparent inorganic material to a component where a sealing film is to be formed, and radiating a beam to the applied paste film to heat the film and make the particles of the transparent inorganic material in the surface layer fuse. By fusing the particles, the surface layer is made a layer with high inorganic material density.

The size of particles of a transparent inorganic material included in the above-described paste is preferably less than or equal to the wavelength of the laser to be radiated, and not ½, ⅓, or "1/natural number" of the wavelength. The paste may contain a solvent or resin, and part of the paste may be removed by laser radiation. The paste is preferably applied with an apparatus called a slit coater.

The laser to be radiated should have a wavelength of approximately 190 to 880 nm and examples of the laser include the excimer laser.

As described above, with the organic EL element of the organic EL display of the present invention, the density of ITO in the transparent electrode (e.g., an ITO electrode) is reduced, so that the light extraction efficiency can be increased. An ITO electrode may be formed by vapor deposition or may be formed by baking an applied ITO nano-metal ink (a paste including ITO nano-particles). Examples of the method of making an ITO electrode by vapor deposition include the method called the reactive plasma deposition method. The reactive plasma deposition method refers to a method of forming a membrane through radiating a plasma beam upon a material from a plasma gun to make the material evaporate, ionizing the evaporated material, and making the ionized material react with a reactive gas in the plasma to form a membrane. The density of the ITO electrode can be controlled adequately by, for example, adjusting the intensity of the plasma beam.

INDUSTRIAL APPLICABILITY

With the organic EL display of the present invention enables high efficiency with respect to the extraction of light from the light emitting layer, so that a low-energy display can be provided.

The present application is based on Japanese Patent Application No. 2005-284326, filed on Sep. 29, 2005, the entire content of which is expressly incorporated by reference herein.

What is claimed is:

1. A display comprising a top-emission organic electroluminescence element having a transparent electrode and a sealing film adjacent to the transparent electrode, the sealing film consisting of at least one transparent inorganic material, wherein: a density of the at least one transparent inorganic material in an inner layer of the sealing film is lower than a density of the at least one transparent inorganic material in an outer layer of the sealing film, and the density of the at least one transparent inorganic material increases gradually from the inner layer towards the outer layer; wherein the inner layer is contiguous with the transparent electrode.

2. The display according to claim 1, wherein the at least one transparent inorganic material is material selected from the group consisting of silicon oxide, silicon nitride, silicon nitride-oxide, and aluminum oxide.

3. The display according to claim 1, wherein:
a value measured by binarizing a scanning electron microscopy image of a cross section of the inner layer of the sealing film with a variable threshold value is 74% or less with respect to an area of the image of the cross section of the inner layer, the value indicating a ratio of an area in which the at least one transparent inorganic material is found.

4. The display according to claim 1, wherein:
a value measured by binarizing a scanning electron microscopy image of a cross section of the inner layer of the sealing film with a variable threshold value is 50% or less with respect to an area of the image of the cross section of the inner layer, the value indicating a ratio of an area in which the at least one transparent inorganic material is found.

5. The display according to claim 1, wherein:
a value measured by binarizing a scanning electron microscopy image of a cross section of the outer layer of the sealing film with a variable threshold value is 90% or less with respect to an area of the image of the cross section of the outer layer, the value indicating a ratio of an area in which the at least one transparent inorganic material is found.

6. The display according to claim 1, wherein a thickness of the sealing film is in a range of 0.1 μm to 10 μm.

7. The display according to claim 1, wherein a thickness of the sealing film is in a range of 1 μm and 10 μm.

8. A manufacturing method of the display according to claim 1, comprising the steps of:
providing a component where the sealing film is to be formed, and a target; and
an ion striking the target to generate a sputtered atom or molecule, and making the sputtered atom or molecule adhere to the component to form the sealing film,
wherein the forming of the sealing film is performed while increasing an ambient temperature of the component, reducing a distance between the component and the target, increasing a voltage applied to between the component and the target, increasing a frequency of a power supply for applying the voltage, increasing an amount of ions to strike the target, or increasing an amount of gas for a source of the ion.

9. A manufacturing method of the display according to claim 1, comprising the steps of:
supplying a source gas to a component where the sealing film is to be formed; and
generating plasma with a high frequency discharge electrode under presence of the source gas to form the sealing film,
wherein the forming of the sealing film is performed while increasing an ambient temperature of the component, reducing a distance between the component and the high frequency discharge electrode, increasing a voltage of the high frequency discharge electrode, increasing a frequency of a power supply for applying the voltage, or increasing a density of the source gas.

10. A manufacturing method of the display according to claim 1, comprising the steps of:
providing a component where the sealing film is to be formed, and a target provided facing the component;
generating plasma around the target to generate ion from the target; and
the ion striking the component to form the sealing film,
wherein the forming of the sealing film is performed while increasing the striking speed of the ion, increasing an ambient temperature of the component, reducing a distance between the component and the target, or increasing a frequency of a power supply for generating the plasma.

11. A manufacturing method of a display according to claim 1, comprising the steps of:
applying a paste containing particles of a transparent inorganic material to a component where the sealing film is to be formed; and
radiating a laser to the applied membrane of the paste.

* * * * *